United States Patent
Tuan

(10) Patent No.: US 8,130,027 B1
(45) Date of Patent: Mar. 6, 2012

(54) APPARATUS AND METHOD FOR THE DETECTION AND COMPENSATION OF INTEGRATED CIRCUIT PERFORMANCE VARIATION

(75) Inventor: Tim Tuan, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 119 days.

(21) Appl. No.: 12/357,703

(22) Filed: Jan. 22, 2009

(51) Int. Cl.
*G05F 1/10* (2006.01)
*G05F 3/02* (2006.01)

(52) U.S. Cl. ......... 327/535; 327/153; 327/530; 327/532

(58) Field of Classification Search .................. 327/530, 327/546, 534–537, 538–543, 141, 144–163; 323/312–317; 363/59, 60; 331/1 A, 15–17; 375/373–376
See application file for complete search history.

(56) References Cited

U.S. PATENT DOCUMENTS

| | | | | |
|---|---|---|---|---|
| 5,534,821 A * | 7/1996 | Akiyama et al. | ..................... | 331/8 |
| 6,041,089 A * | 3/2000 | Yokomizo | ..................... | 375/371 |
| 6,154,097 A * | 11/2000 | Yoshioka | ..................... | 331/18 |
| 6,832,173 B1 * | 12/2004 | Starr et al. | ..................... | 702/106 |
| 7,046,057 B1 * | 5/2006 | Culler | ..................... | 327/156 |
| 7,088,197 B2 * | 8/2006 | Brosh et al. | ..................... | 331/186 |
| 7,250,807 B1 * | 7/2007 | Doyle | ..................... | 327/534 |
| 7,400,123 B1 * | 7/2008 | Voogel | ..................... | 323/280 |
| 7,549,139 B1 * | 6/2009 | Tuan et al. | ..................... | 716/17 |
| 7,583,774 B2 * | 9/2009 | Lesso | ..................... | 375/377 |
| 2002/0005763 A1 * | 1/2002 | Aoki | ..................... | 331/11 |
| 2002/0140470 A1 * | 10/2002 | Aoki et al. | ..................... | 327/157 |
| 2008/0086706 A1 * | 4/2008 | Barrows et al. | ..................... | 716/5 |
| 2008/0186082 A1 * | 8/2008 | Singh et al. | ..................... | 327/539 |
| 2010/0033235 A1 * | 2/2010 | Ikenaga et al. | ..................... | 327/537 |

* cited by examiner

*Primary Examiner* — Lincoln Donovan
*Assistant Examiner* — Brandon S Cole
(74) *Attorney, Agent, or Firm* — Michael T. Wallace; John J. King

(57) ABSTRACT

An apparatus and method for the dynamic detection and compensation of performance variations within an integrated circuit (IC) is provided to detect performance variations within the IC at any stage of test or operation. An arbitrary reference signal is utilized in conjunction with an internal oscillation device to establish a speed reference that may be used to characterize the IC. Dynamic detection and compensation may also be configured within a plurality of geographic locations within the IC, so that performance variations may be detected and compensated. Test data that is indicative of the IC's performance may be dynamically generated continuously, or at programmable intervals, so that performance variations caused by virtually any source may be substantially detected and compensated at any point in time of the IC's life cycle.

13 Claims, 6 Drawing Sheets

APPARATUS AND METHOD FOR THE DETECTION AND COMPENSATION OF INTEGRATED CIRCUIT PERFORMANCE VARIATION

FIELD OF THE INVENTION

The present invention generally relates to integrated circuits, and more particularly to the detection and compensation of performance variations within the integrated circuits.

BACKGROUND OF THE INVENTION

Advances in the field of semiconductor integrated circuits (ICs) have brought about higher levels of integration. Accordingly, semiconductor manufacturing process advancements are driving the corresponding geometric dimensions of semiconductor devices to decreasingly smaller values. 10 micrometer (μm) gate lengths, for example, were common in the 1970's, but continuously advancing semiconductor manufacturing processes have reduced gate lengths to well below 100 nanometers (nm) for deep sub-micron integrated circuit (IC) design.

One key challenge in deep sub-micron design is the increase in process variation, which may lead to significant IC performance fluctuation in key operating parameters such as propagation speed and leakage power. Temperature, aging, and other sources of variation may also contribute to performance fluctuations within the IC. As a result, design specifications for the IC must be much more stringent than would ordinarily be imposed, so as to accommodate for such performance variation.

A conventional method to reduce the effects of performance variation is to detect when the IC's propagation speed differs from the specified propagation speed for the IC. Decreased magnitudes of supply voltage and/or transistor body biasing may be employed, for example, to compensate for propagation speeds above the specified propagation speed. Conversely, increased magnitudes of supply voltage and/or transistor body biasing may be employed to compensate for propagation speeds below the specified propagation speed.

In particular, by reducing/increasing one or both of the supply voltage and/or transistor body bias, a commensurate reduction/increase in the propagation speed may be realized, since a directly proportional relationship exists between supply voltage/transistor body bias and propagation speed. A significant power reduction may also be realized when reduction of the propagation speed is desired, since supply voltage and transistor body bias each exhibit an exponential and directly proportional relationship to leakage power.

Conventional speed characterization of an IC may be performed at wafer sort, or final product test, to determine, for example, whether the IC's actual propagation speed is different from the IC's specified propagation speed. Propagation speed test results may then be stored within non-volatile memory of the IC for subsequent usage by a control circuit when compensation of the IC's propagation speed is desired.

Automated test equipment (ATE), for example, may be used to ascertain the propagation speed that is exhibited by the IC. A communication interface, such as an inter-IC ($I^2C$) communication bus, may then utilize bi-directional, 2-wire communication to store and verify the propagation speed test results within the non-volatile memory of the IC. In a subsequent compensation process, a programmable voltage regulator and/or body biasing circuit may then be utilized to provide the requisite supply voltage and/or transistor body bias, respectively, that is required to adjust the propagation speed to within specification.

Such a characterization and compensation process, however, requires that each IC be characterized, whether or not the propagation speed is out of specification, because the programmable voltage regulator and/or body biasing circuit nevertheless requires the pre-recorded test data in order to set their respective output voltage levels. Furthermore, non-volatile memory and a communication interface are also required to store and verify the pre-recorded test data. Still further, dynamic variations in IC performance levels, such as may be caused by temperature or aging effects, cannot be compensated.

In other conventional control circuits, such as illustrated in FIG. 1, an oscillator, such as voltage controlled oscillator (VCO) 104, may be utilized in conjunction with a dedicated external frequency reference signal, REFERENCE, to detect and compensate for the exhibited propagation speed of the IC. The control circuit of FIG. 1, for example, utilizes feedback to control the magnitude of the power supply voltage, $V_{CC}$, and/or the transistor body bias voltage, $V_{bb}$, so that the frequency provided by oscillator 104 matches the dedicated external frequency reference signal, REFERENCE. By using a dedicated external reference signal whose frequency is substantially equal to the specified propagation speed of the IC, appropriate voltage magnitude levels may then be selected via feedback for the power supply voltage, $V_{CC}$, and/or the transistor body bias voltage, $V_{bb}$, so that the output frequency of oscillator 104 matches the dedicated external frequency reference signal, REFERENCE.

In operation, counter 102 counts the number of rising/falling edge occurrences of the dedicated external frequency reference signal, REFERENCE, and counter 106 counts the number of rising/falling edge occurrences of the signal provided by oscillator 104. Comparator 108 then determines the relative frequency difference between the two signals and generates a control signal that is indicative of the detected frequency difference. Regulator control 110 and bias control 112 then utilize the frequency difference control signal from comparator 108 to program the magnitude of the regulated voltages, $V_{CC}$ and $V_{bb}$, as provided by regulators 116 and 114, respectively, in accordance with the frequency difference control signal.

By operation of the feedback to oscillator 104, the frequency difference between the dedicated external frequency reference signal, REFERENCE, and the signal provided by oscillator 104 is substantially removed. Since oscillator 104 is implemented within the IC under test, oscillator 104 exemplifies the propagation speed of the IC under test because oscillator 104 is subject to variations that may affect the propagation speed of oscillator 104. As such, by controlling the frequency of operation of oscillator 104 through feedback of the regulator control and bias control feedback voltages, $V_{CC}$ and $V_{bb}$, the propagation speed of the IC under test may be adequately selected.

The control circuit of FIG. 1, however, requires a dedicated frequency reference signal in order to adequately select the propagation speed of the IC under test. If the dedicated frequency reference signal is generated external to the IC under test, then the cost and complexity of the system is adversely affected because a dedicated frequency reference signal must be provided and maintained. If, on the other hand, the dedicated frequency reference signal is generated internal to the IC under test, then the dedicated frequency reference signal is susceptible to the same process, temperature, aging, and other variations that affect the propagation speed of the IC under test.

SUMMARY OF THE INVENTION

To overcome limitations in the prior art, and to overcome other limitations that will become apparent upon reading and understanding the present specification, various embodiments of the present invention disclose an apparatus and method to detect and compensate for performance variations within integrated circuits.

In accordance with one embodiment of the invention, a method of detecting and compensating for performance variation within an integrated circuit comprises configuring an oscillating signal within a region of the integrated circuit to determine a propagation speed of the integrated circuit, selecting an arbitrary reference signal for comparison to the propagation speed of the integrated circuit, where comparison circuitry within the integrated circuit is configured to be compatible with the arbitrary reference signal. The method further comprises comparing a frequency of operation of the oscillating signal to a frequency of operation of the arbitrary reference signal to determine a frequency difference between the oscillating signal and the arbitrary reference signal, applying a voltage signal to the region of the integrated circuit, and modifying a magnitude of the voltage signal to substantially remove the frequency difference.

In accordance with another embodiment of the invention, a detection and compensation circuit configured within a portion of an integrated circuit comprises a ring oscillator that is configured to generate an oscillating signal, the oscillating signal being indicative of a propagation speed of the integrated circuit. The detection and compensation circuit further comprises a first counter that is coupled to receive the oscillating signal, where the first counter is adapted to assert a trigger signal in response to detecting an integer number of logic transitions of the oscillating signal. The detection and compensation circuit further comprises a second counter that is coupled to receive a reference signal and the trigger signal, the second counter being adapted to provide a measured count value that indicates the number of transitions of the reference signal that have occurred prior to the assertion of the trigger signal. The detection and compensation circuit further comprises comparator logic that is coupled to the second counter and is further coupled to receive a target count value. The comparator logic is adapted to modify the propagation speed of the integrated circuit in response to a determination that the measured count value is different than the target count value. The frequency of operation of the reference signal is independent of the propagation speed of the integrated circuit.

In accordance with another embodiment of the invention, an integrated circuit comprises a configuration memory space that is coupled to receive a configuration bit stream to define a plurality of logic regions within the integrated circuit. The integrated circuit comprises a detection circuit that is configured within each of the plurality of logic regions in response to receiving the configuration bit stream. Each detection circuit includes a ring oscillator that is adapted to generate an oscillating signal, the oscillating signal being indicative of a propagation speed of the respective region. The detection circuit further comprising a first counter that is coupled to receive the oscillating signal, the first counter being adapted to assert a trigger signal in response to detecting an integer number of logic transitions of the oscillating signal. The detection circuit further comprising a second counter that is coupled to receive a reference signal and the trigger signal, the second counter being adapted to provide a measured count value that indicates the number of transitions of the reference signal that occurred prior to the assertion of the trigger signal. The integrated circuit further comprises a compensation circuit that is configured within the integrated circuit in response to receiving the configuration bit stream. The compensation circuit including comparator logic that is coupled to receive a target count value and is adapted to modify the propagation speed of the integrated circuit in response to a determination that one of the measured count values is different than the target count value.

BRIEF DESCRIPTION OF THE DRAWINGS

Various aspects and advantages of the invention will become apparent upon review of the following detailed description and upon reference to the drawings in which.

DETAILED DESCRIPTION

Generally, various embodiments of the present invention provide an apparatus and method for the dynamic detection and compensation of performance variations within an integrated circuit (IC), such as a programmable logic device (PLD). The dynamic detection and compensation apparatus of the present invention may be used to detect performance variations within the IC at any stage of test or operation. As such, process based performance variations, for example, may be detected and compensated at wafer sort, or final product test. Other performance variations, such as may be caused by temperature and aging, may be dynamically detected and compensated continuously, or at programmable intervals, while the IC is deployed within its respective system.

In one embodiment, the IC utilizes an arbitrary reference signal, such as the system clock that is already utilized within the system that the IC is deployed within, to establish a speed reference that may be used to characterize the IC. The dynamic detection and compensation apparatus may also be configured within various geographic locations within the PLD, so that performance variations that are relative to the specific die location may be detected to form a statistical average of performance variation. Appropriate compensation may then be employed in accordance with the statistically averaged performance variation to more accurately compensate for geographically based performance variations.

Since detection of the performance variations of the IC may be executed at any stage of test or IC operation, non-volatile memory is not required to store previously generated test data. Instead, test data that is indicative of the IC's performance may be dynamically generated continuously, or at programmable intervals, so that performance variations caused by virtually any source may be substantially detected and compensated at any point in time of the IC's life cycle.

Still further, the dynamic detection and compensation apparatus of the present invention may be configured as a dedicated core or a configurable/reconfigurable "soft" core within the PLD. Detection of performance variations, therefore, may be enhanced through utilization of a variety of components, such as random access memory blocks (BRAMs) or configurable logic blocks (CLBs), that may be configured to implement a portion of the performance variation detection apparatus. As such, performance variation detection may be implemented with various types of configurable and/or dedicated logic that may react differently to process, temperature, and/or aging characteristics.

Figure 1:
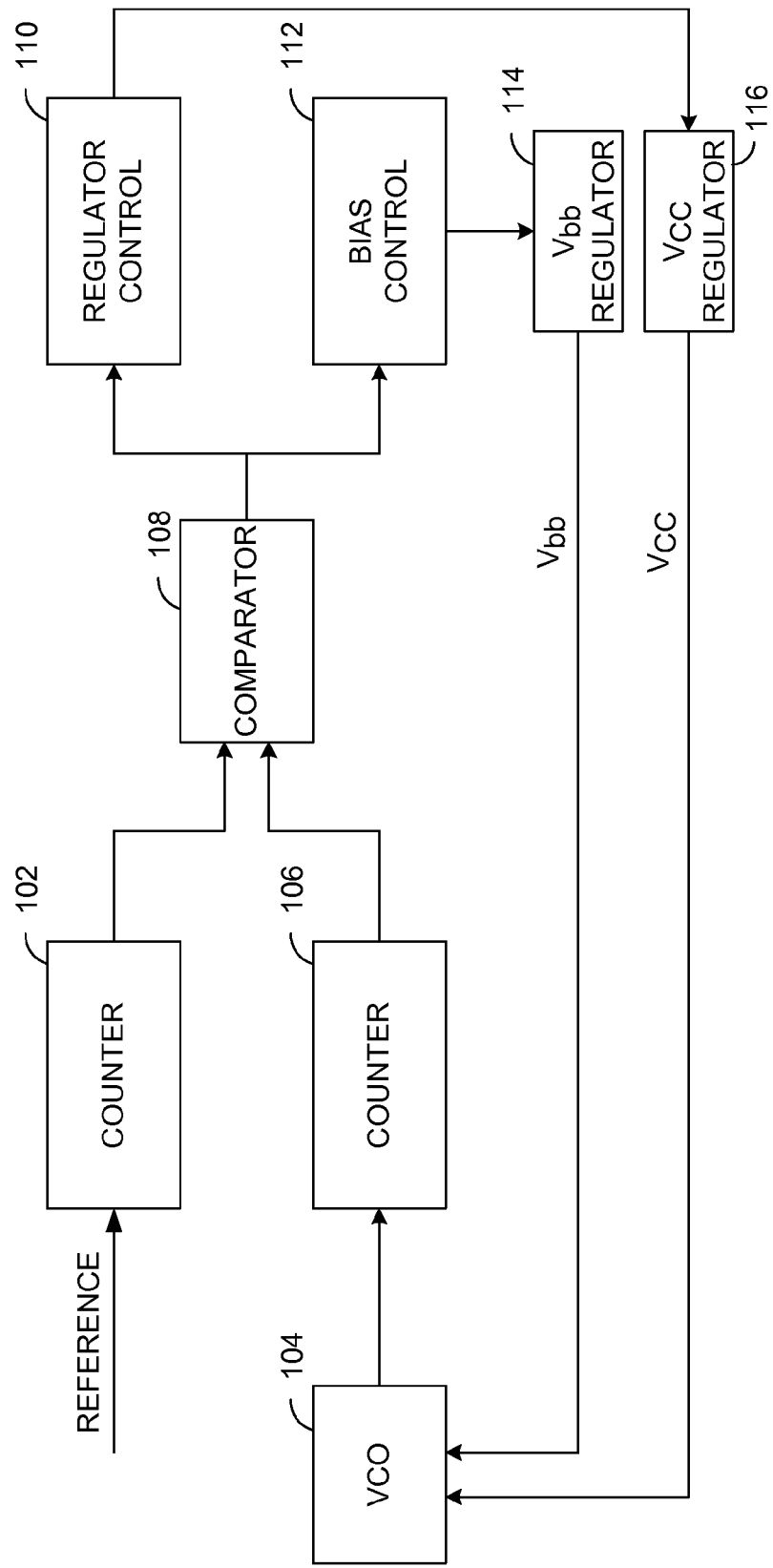
FIG. 1 illustrates a conventional control circuit that may be used to detect and compensate for performance variation within an integrated circuit (IC)
Figure 2:
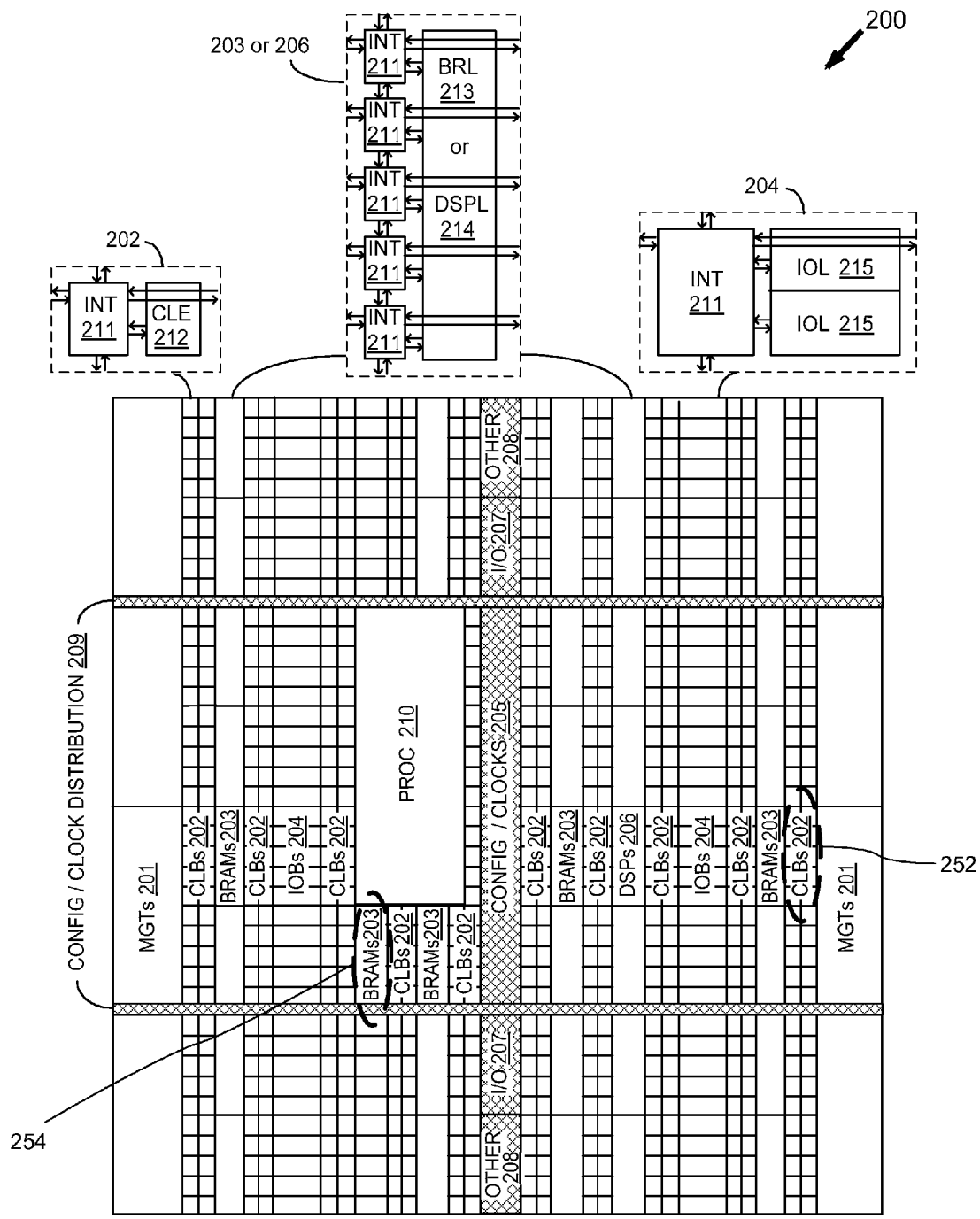
FIG. 2 illustrates an exemplary Field Programmable Gate Array (FPGA) architecture.

Turning to FIG. 2, for example, FPGA architecture 200 is illustrated that includes a number of programmable tiles that may react differently to process, temperature, and/or aging variations based upon their logic type, or conversely, their geographic location within the die. The programmable logic tiles of FPGA architecture 200 may include multigigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. Some FPGAs also include dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 206 can include a DSP logic element (DSPL 214) in addition to an appropriate number of programmable interconnect elements. An IOB 204 can include, for example, two instances of an input/output logic element (IOL 215) in addition to one instance of the programmable interconnect element (INT 211). As will be clear to those of skill in the art, the actual I/O pads connected, for example, to the I/O logic element 215 typically are not confined to the area of the input/output logic element 215.

In the pictured embodiment, a columnar area near the center of the die (shown shaded in FIG. 2) is used for configuration memory cells, i.e., the so-called "configuration memory space", clock, and other control logic. Horizontal areas 209 extending from this column are used to distribute the clocks and configuration signals across the breadth of the FPGA. For example, the various phase variants of clock signals generated by the DCMs of the FPGA may be distributed to various user logic regions that may be configured across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. For example, the number of logic blocks in a column, the relative width of the columns, the number and order of columns, the types of logic blocks included in the columns, the relative sizes of the logic blocks, and the interconnect/logic implementations included at the top of FIG. 2 are purely exemplary. For example, in an actual FPGA, more than one adjacent column of CLBs are typically included wherever the CLBs appear, to facilitate the efficient implementation of user logic, but the number of adjacent CLB columns varies with the overall size of the FPGA.

As can be seen from FIG. 2, various regions of FPGA 200 are dedicated to a specific type of logic block. As such, process, temperature, aging, and/or other sources of variation may manifest themselves differently depending upon the logic type and/or geographic location. For example, BRAMs 203 of region 254 may be affected differently as compared to other BRAMs 203 that are located elsewhere within FPGA 200 due to the increased temperature of region 254 that may be caused by processor block PROC 210. Alternately, process and other variations of FPGA 200 may affect user logic that is located within region 252 differently than user logic that is located within other regions of FPGA 200.

Accordingly, the various embodiments of the present invention are provided to configure ICs, such as FPGA 200, for efficient and dynamic detection of performance variations of every geographic location within FPGA 200. Control circuitry may also be configured within FPGA 200 to compensate for the detected performance variations.

Figure 3:
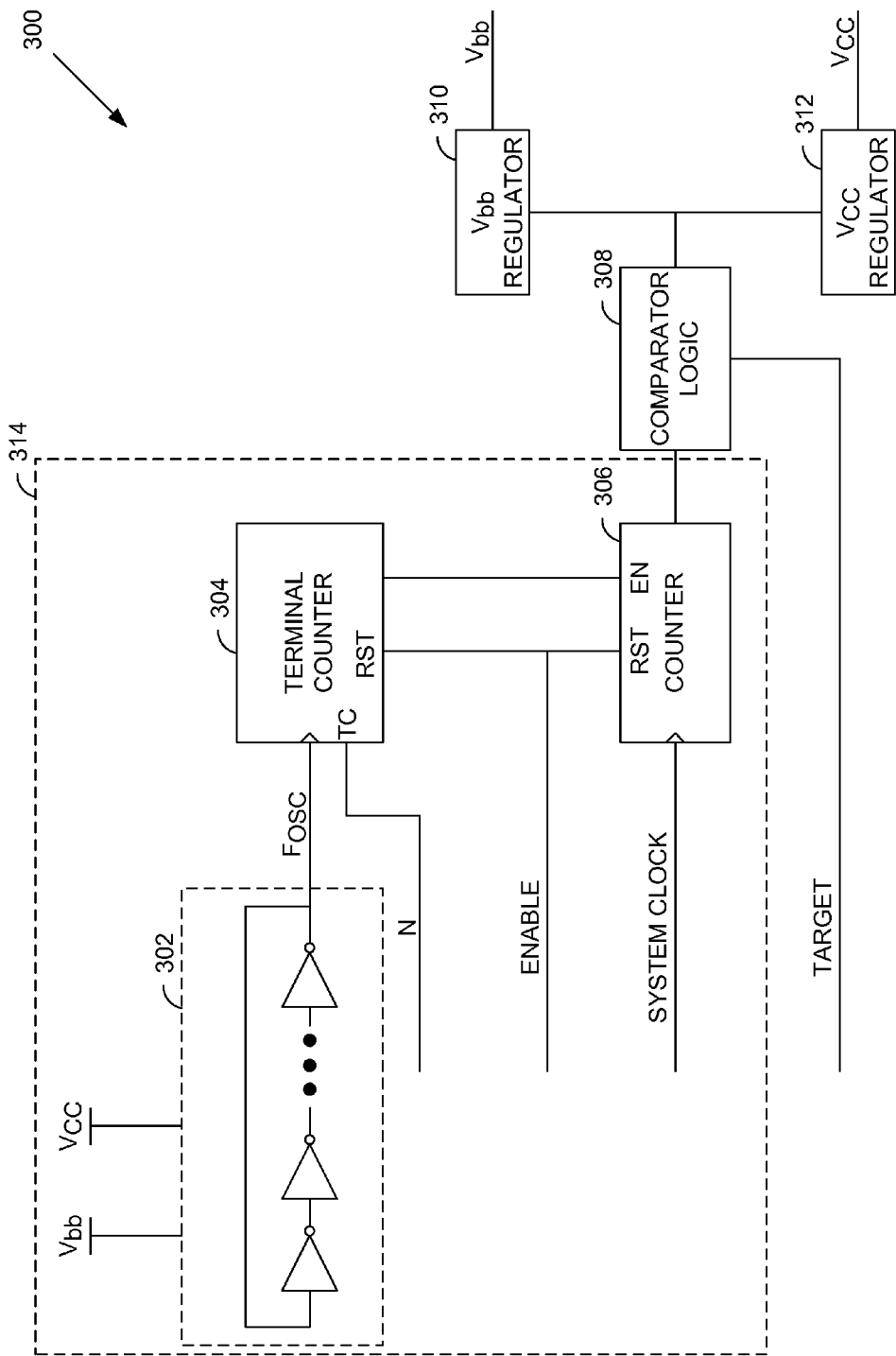
FIG. 3 illustrates a control circuit that may be used to dynamically detect and compensate for performance variations within an IC such as the FPGA of FIG. 2 in accordance with one embodiment of the present invention.

Turning to FIG. 3, for example, detection and compensation circuit 300 may be configured within the various geographic locations of FPGA 200 as discussed above in relation to FIG. 2. In particular, a configuration bit stream may be downloaded into the configuration memory space of FPGA 200, so as to configure detection and compensation circuit 300 as a "soft" core within FPGA 200. Alternatively, detection and compensation circuit 300 may be implemented within FPGA 200 as a dedicated core of logic that is not user definable, but rather operates in a background mode of operation to continuously, or at programmable intervals, detect and compensate for performance variations.

An oscillation device, such as ring oscillator 302, may be configured within FPGA 200 to provide a test signal, $F_{OSC}$, that is indicative of the propagation speed exhibited by FPGA 200. That is to say, in other words, that the frequency of operation of ring oscillator 302 is inversely proportional to the product of the number of inverting devices contained within ring oscillator 302 and the propagation delay of each inverting device. For example, if 5 inverting devices exist within ring oscillator 302 and each inverting device exhibits a propagation delay of 10 ns, the frequency of operation of ring oscillator 302 may be estimated to be:

$$F_{OSC} = \frac{1}{(2*\tau_d*n)} = \frac{1}{(2*10 \text{ ns}*5)} = 10 \text{ MHz}, \quad (1)$$

where $\tau_d$ is the delay of each inverting device contained within ring oscillator 302 and n is the number of inverting devices contained within ring oscillator 302. Thus, the frequency of oscillation of test signal, $F_{OSC}$, may be adjusted by increasing or decreasing an integer number of inverting devices contained within ring oscillator 302 as determined by equation (1), so long as the integer number is an odd value.

Depending upon performance variations of FPGA 200, the frequency of operation of test signal, $F_{OSC}$, may be slightly higher, or slightly lower, than the frequency calculated in equation (1). If the frequency of operation of test signal, $F_{OSC}$, is higher than the frequency calculated in equation (1), then a corresponding decrease in the power supply voltage magnitude, or the transistor body bias potential, may be utilized to implement a reduction in the frequency of operation of test signal, $F_{OSC}$, to substantially match the frequency calculated in equation (1). If, on the other hand, the frequency of operation of test signal, $F_{OSC}$, is lower than the frequency calculated in equation (1), then a corresponding increase in the power supply voltage magnitude, or the transistor body bias potential, may be utilized to implement an increase in the frequency of operation of test signal, $F_{OSC}$, to substantially match the frequency calculated in equation (1).

In operation, an arbitrary reference signal, SYSTEM CLOCK, having an arbitrary frequency of operation is utilized in conjunction with test signal, $F_{OSC}$, to implement a speed reference to detect the relative propagation speed of FPGA 200. Reference signal, SYSTEM CLOCK, is arbitrary because the frequency of operation of reference signal, SYSTEM CLOCK, is independent of the propagation speed of FPGA 200 and further because the frequency of operation of reference signal, SYSTEM CLOCK, is generally not equal to the frequency of operation of test signal, $F_{OSC}$.

Oscillator 302, terminal counter 304, and counter 306 implement compensation circuit 314, which is utilized to determine the relative propagation speed of FPGA 200 in relation to a target propagation speed. In particular, terminal counter 304 is utilized to indicate when the number of rising edge/falling edge occurrences of test signal, $F_{OSC}$, have reached a terminal count value since the assertion of signal ENABLE. Counter 306 is concurrently utilized to begin counting the number of rising edge/falling edge occurrences of signal, SYSTEM CLOCK, in response to the assertion of signal ENABLE. Once terminal counter 304 reaches the terminal count, as programmed by signal N, enable pin, EN, of counter 306 is asserted, which then causes the count value contained within counter 306 to be latched within comparator logic 308. Comparator logic 308 then compares the count value of counter 306 to a target count value, TARGET, to determine whether the propagation speed of ring oscillator 302 is different from the specified propagation speed of FPGA 200.

In particular, the target count value, TARGET, may be programmed in the configuration bit stream to be equal to:

$$\text{TARGET} = \frac{N * F_{SYSTEMCLOCK}}{F_{OSC}}, \quad (2)$$

where $F_{SYSTEMCLOCK}$ is the frequency of operation of the arbitrary reference signal, SYSTEM CLOCK, $F_{OSC}$ is the frequency of operation of ring oscillator 302 that may be subject to performance variation, and N is a programmable integer value that sets the terminal count of counter 304. If TARGET is greater than the count value of counter 306, then test signal $F_{OSC}$ is determined to be operating at a frequency that is greater than the specified propagation speed of FPGA 200. In response, comparator logic 308 provides appropriate control signals to $V_{bb}$ regulator 310 and/or $V_{CC}$ regulator 312 to reduce the respective output voltage magnitudes of $V_{bb}$ and/or $V_{CC}$, which in turn retards the propagation speed of ring oscillator 302.

If, on the other hand, TARGET is less than the count value of counter 306, then test signal $F_{OSC}$ is determined to be operating at a frequency that is lower than the specified propagation speed of FPGA 200. In response, comparator logic 308 provides appropriate control signals to $V_{bb}$ regulator 310 and/or $V_{CC}$ regulator 312 to increase the respective output voltage magnitudes of $V_{bb}$ and/or $V_{CC}$, which in turn accelerates the propagation speed of ring oscillator 302.

It is noted that the terminal count value, N, of equation (2) is not arbitrary. An increased value of N, for example, yields increased resolution for the determination of the propagation speed of FPGA 200, but also increases the amount of time required for propagation speed detection. N may also be programmed using the configuration bit stream as discussed above, or may be "hard-wired" within the design of FPGA 200. Thus, the determination of the value of N depends upon a number of variables including: the frequency of operation of the arbitrary reference signal, SYSTEM CLOCK; the desired resolution of the propagation speed control; and the desired latency of the propagation speed detection/compensation process.

An exemplary operation scenario of control circuit 300 of FIG. 3 is now presented to further illuminate the present invention. Ring oscillator 302 may be designed to provide a frequency of operation of signal, $F_{OSC}$, to be, e.g., 1 MHz. The terminal count value, N, may be programmed to be 1000. The operating frequency of the arbitrary reference signal, SYSTEM CLOCK, that is already operating within the system that FPGA 200 is deployed within, may be equal to 133 MHz. In such an instance, the value of TARGET may be calculated as in equation (2) to be equal to 133000.

Should FPGA 200 exhibit a propagation speed that is 8% faster than a specified propagation speed, signal $F_{OSC}$ will exhibit a frequency of operation that is also 8% faster than desired, e.g., 1.08 MHz. Once counter 304 reaches the terminal count of 1000, an elapsed time of $1000/1.08e^6$=925.9 µs will have transpired. During the expired time, counter 306 will have counted to $(925.9e^{-6})*(133e6)$=123,148. Thus, the excess propagation speed exhibited by the IC is detected to be $(133000/123,148)-1)*100$=8%. Comparator logic 308 may then decrease the voltage magnitudes provided by $V_{bb}$ regulator 310 and/or $V_{CC}$ regulator 312 so that the excess propagation speed may be commensurately reduced. Several detection/compensation iterations may be required to achieve the desired propagation speed compensation.

Signal ENABLE may be asserted from a dedicated controller within FPGA 200, or conversely, may be asserted by a user signal. Thus, propagation speed detection/compensation may be performed at any programmable instant in time, such as upon user command, system power-up, at programmable intervals, or continuously during operation of the IC.

Figure 4:
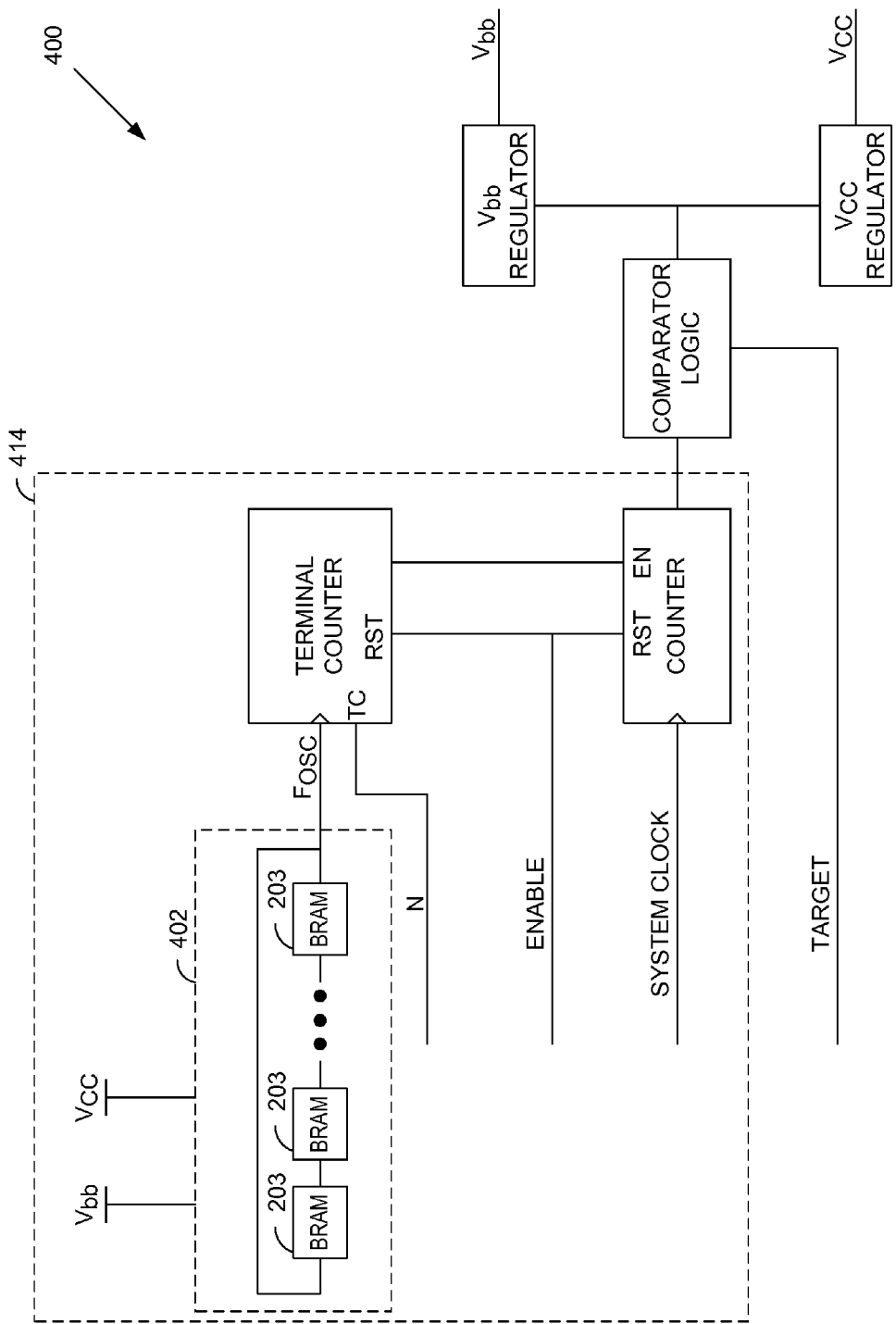
FIG. 4 illustrates a control circuit that may be used to dynamically detect and compensate for performance variations within an IC such as the FPGA of FIG. 2 in accordance with an alternate embodiment of the present invention.

Turning to FIG. 4, an alternate embodiment of detection and compensation circuit 400 is illustrated, whereby compensation circuit 414 contains ring oscillator 402, which is implemented with an odd number of BRAM 203 devices, as discussed above in relation to FIG. 2. In such an instance, inverting outputs of BRAM 203 devices are daisy chained to respective inputs of BRAM 203 devices to implement ring oscillator 402 as illustrated.

Similar to ring oscillator 302 of FIG. 3, ring oscillator 402 may be configured within FPGA 200 to provide a test signal, $F_{OSC}$, that is indicative of the propagation speed exhibited by BRAM 203 devices of FPGA 200. As discussed above in relation to equation (1), the frequency of operation of ring oscillator 402 is inversely proportional to the product of the number of BRAM 203 devices contained within ring oscillator 402 and the propagation delay of each BRAM 203 device. Since BRAM 203 devices are implemented throughout FPGA 200, propagation speed statistics may be gathered across FPGA 200 so as to account for performance variations that may be due to geographic location within the semiconductor die.

Depending upon performance variations of FPGA 200 that are specific to on-die location, the frequency of operation of test signal, $F_{OSC}$, may be slightly higher, or slightly lower, than the frequency calculated in equation (1). If the frequency of operation of test signal, $F_{OSC}$, is higher than the frequency calculated in equation (1), then a corresponding decrease in the power supply voltage magnitude, or the transistor body bias potential, may be utilized to implement a reduction in the frequency of operation of test signal, $F_{OSC}$, to substantially match the frequency calculated in equation (1). If, on the other hand, the frequency of operation of test signal, $F_{OSC}$, is lower than the frequency calculated in equation (1), then a corresponding increase in the power supply voltage magnitude, or the transistor body bias potential, may be utilized to implement an increase in the frequency of operation of test signal, $F_{OSC}$, to substantially match the frequency calculated in equation (1).

The operation of detection and compensation circuit 400 is similar to that of FIG. 3, whereby an arbitrary reference signal, SYSTEM CLOCK, having an arbitrary frequency of operation is utilized in conjunction with test signal, $F_{OSC}$, to implement a speed reference to detect the relative propagation speed of BRAM 203 devices located within FPGA 200. If the relative propagation speed of BRAM 203 devices does not match a target propagation speed of the FPGA, then voltage regulators may be utilized as discussed above to adjust the power supply voltage magnitude, or the transistor body bias potential, so that the requisite change in propagation speed may be obtained.

Figure 5:
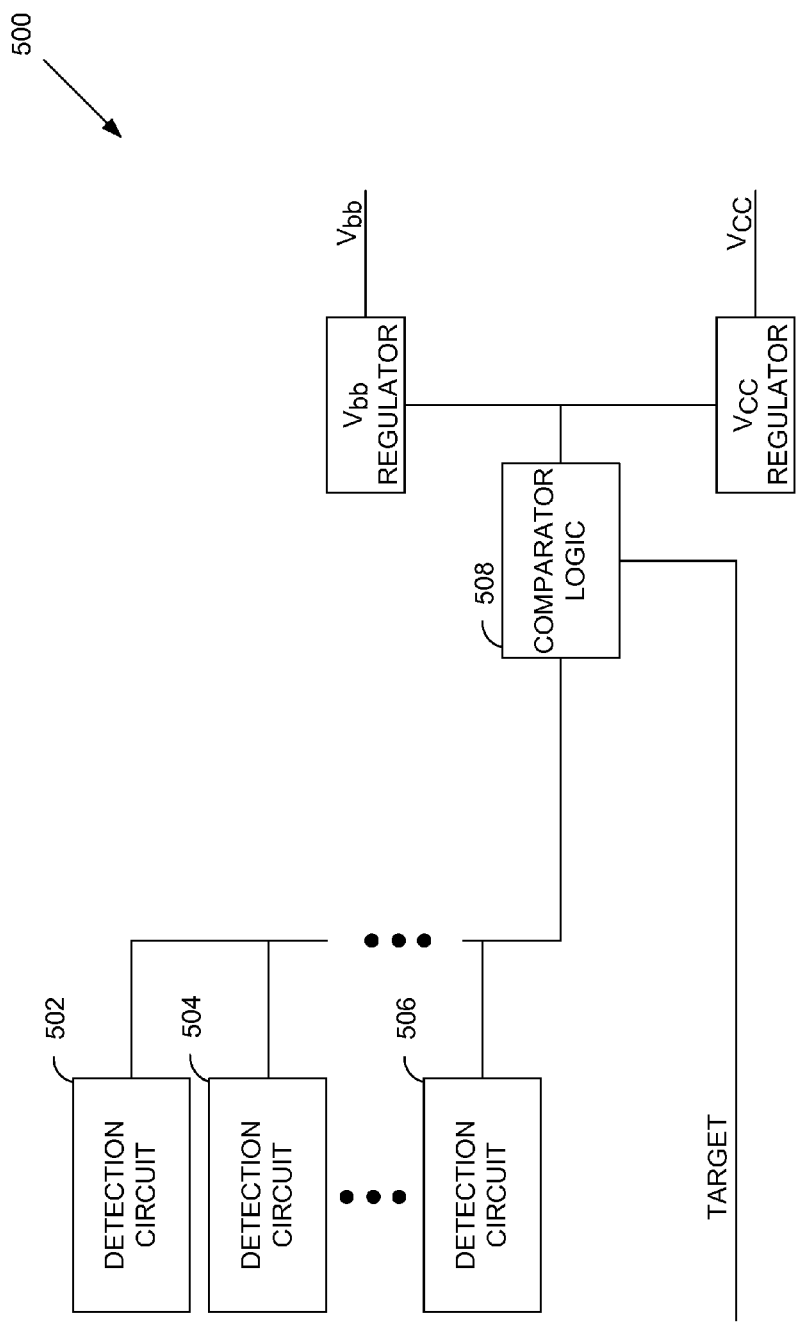
FIG. 5 illustrates a control circuit that may be used to dynamically detect and compensate for performance variations within an IC such as the FPGA of FIG. 2 in accordance with an alternate embodiment of the present invention.

In alternate embodiments, multiple detection circuits may be instantiated within various regions of the IC, whereby propagation speed statistics taken from each region may be taken into account, so that worst-case on-die variations due to, e.g., geographic location, may be compensated globally across the IC. By implementing multiple detection circuits 502-506 within the various regions of the IC, as illustrated in FIG. 5 for example, propagation speed statistics may be taken across the entire die by comparator logic 508. Comparator logic 508 then determines the worst-case operation, e.g., the slowest propagation speed as detected by one of detection circuits 502-506. In response, comparator logic 508 provides the appropriate control signals to respective $V_{bb}$ and/or $V_{CC}$ regulators to increase/decrease the respective output voltage magnitudes of $V_{bb}$ and/or $V_{CC}$, which in turn compensates for the worst-case propagation speed globally across the die. It is noted that detection circuits 502-506 may be implemented as detection circuits 314 or 414 as discussed above in relation to FIG. 3 or 4, or as any chain of inverting devices.

In alternate embodiments, multiple detection and compensation circuits may be instantiated within the various regions of the IC, whereby propagation speed measurements and corresponding compensation signals may be applied within each region, so that on-die variations of each region may be separately detected and compensated. In such instances, detection circuits 314 and/or 414 may be instantiated within each region along with corresponding compensation circuitry, so that each region may be separately adjusted to operate in accordance with a target performance specification for each region.

Figure 6:
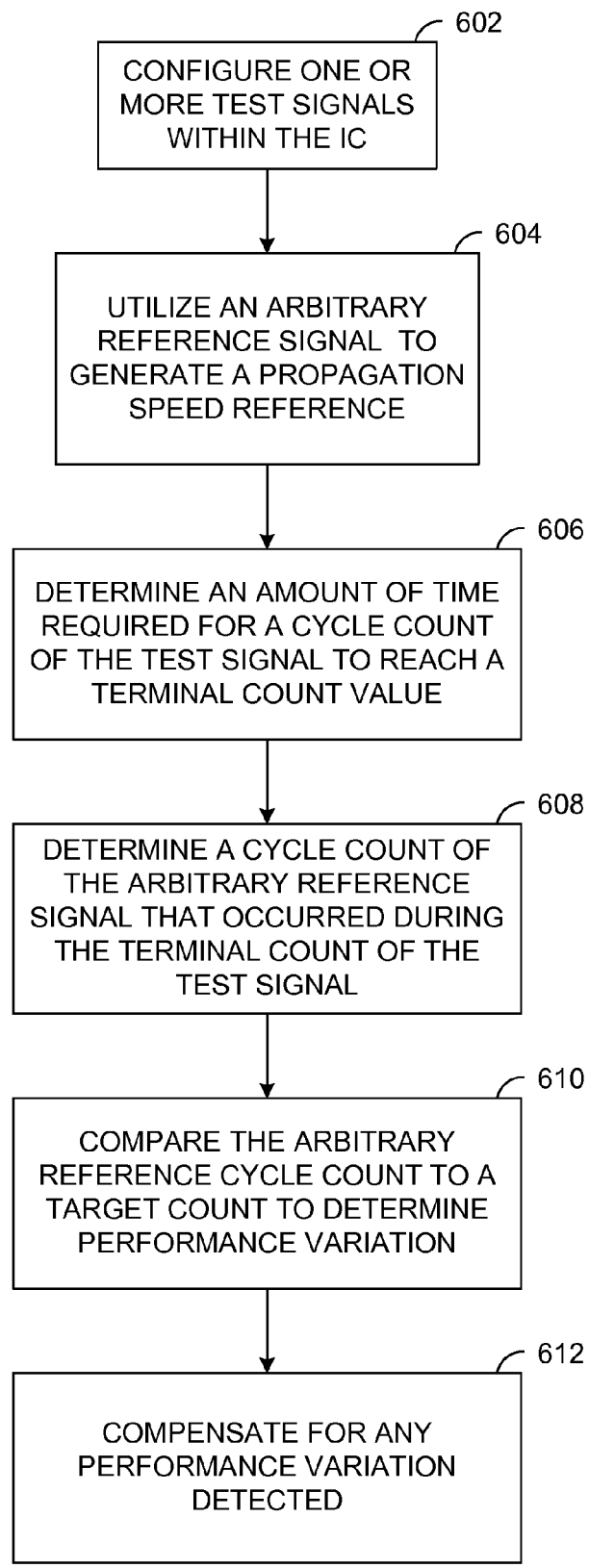
FIG. 6 illustrates a flow diagram of a method to dynamically detect and compensate for performance variations within an IC in accordance with one embodiment of the present invention.

Turning to FIG. 6, a flow diagram of a method to dynamically detect and compensate for performance variations within one or more regions of an IC in accordance with the various embodiments of the present invention is illustrated. In step 602, one or more oscillation devices, such as ring oscillator 302 or 402, may be configured within one or more regions of an IC, such as FPGA 200, to provide one or more test signals, $F_{OSC}$, that are indicative of the propagation speed exhibited by the one or more regions of the IC. As discussed above, the frequency of oscillation of test signal(s), $F_{OSC}$, may be adjusted by increasing or decreasing an integer number of inverting devices contained within the oscillation device as determined by equation (1), so long as the integer number is an odd value.

In step 604, an arbitrary reference signal, SYSTEM CLOCK, having an arbitrary frequency of operation is utilized in conjunction with test signal(s), $F_{OSC}$, to implement a speed reference to detect the relative propagation speed of the one or more regions of the IC. In step 604, one or more terminal counters, for example, are enabled to indicate when a number of cycles of the test signal(s), $F_{OSC}$, have reached a terminal count value. One or more other counters are concurrently utilized to begin counting the number of cycles of signal, SYSTEM CLOCK.

Once the terminal counter(s) reaches the terminal count, the enable pin of the other counter(s) is asserted in step 606, which then causes the count value contained within the other counter(s) to be latched within comparator logic as in step 608. In one embodiment, the comparator logic compares the count value of each of the other counters to a target count value in step 610 to determine, e.g., a worst-case propagation speed of the IC. In response, the comparator logic then provides appropriate power supply magnitude and/or transistor bias magnitude variation in step 612 to compensate for the worst-case propagation speed globally across the IC. In an alternate embodiment, comparator logic may exist in each region of the IC, whereby appropriate power supply magnitude and/or transistor bias magnitude variations are implemented in step 612 to compensate for the propagation speeds of each region within the IC.

Propagation delay through a standard metal oxide semiconductor field effect transistor (MOSFET), for example, is inversely proportional to the voltage magnitude of operational power that is applied to the operational power input terminal of the MOSFET. Thus, by increasing the voltage magnitude at the operational power input terminal, a commensurate decrease in propagation delay is realized, which increases the propagation speed through the MOSFET. Similar variations in propagation speed may be obtained by applying varying magnitudes of bias potential to the well region of the MOSFET. Thus, power supply magnitude and/or well bias magnitude variations may be implemented within step 612 to adequately compensate for the propagation speed variations that may be exhibited within the one or more regions of the IC due to process, temperature, aging, or other performance varying sources.

Other aspects and embodiments of the present invention will be apparent to those skilled in the art from consideration of the specification and practice of the invention disclosed herein. For example, operation of the present invention provides power supply and/or transistor bias potentials, such that the propagation speed of the IC just satisfies the specified propagation speed. The frequency of operation of test signal, $F_{OSC}$, may instead by increased slightly so as to provide margin between the specified propagation speed and the realized propagation speed of the IC. It is intended that the specification and illustrated embodiments be considered as examples only, with a true scope and spirit of the invention being indicated by the following claims.

What is claimed is:

1. A method of detecting and compensating for performance variation within an integrated circuit, the method comprising:

configuring a plurality of oscillating signals in a plurality of regions of the integrated circuit to determine a propagation speed of each of the plurality of regions of the integrated circuit, wherein each of the plurality of regions is coupled to receive a regulated voltage signal;

selecting an arbitrary reference signal for comparison to the propagation speeds of the plurality of regions of the integrated circuit, wherein comparison circuitry within the integrated circuit is configured to be compatible with the arbitrary reference signal;

comparing a frequency of operation of each of the plurality of regions of the integrated circuit to a frequency of operation of the arbitrary reference signal to determine a slowest propagation speed of the plurality of regions of the integrated circuit;

applying the regulated voltage signal to the plurality of regions of the integrated circuit, the regulated voltage signal enabling operation of the plurality of regions of the integrated circuit; and modifying a magnitude of the regulated voltage signal to compensate for the slowest propagation speed of the plurality of regions of the integrated circuit.

2. The method of claim 1, wherein configuring a plurality of oscillating signals in a plurality of regions of the integrated circuit comprises configuring a ring oscillator within a region of the plurality of regions of the integrated circuit to generate an oscillating signal of the plurality of oscillating signals.

3. The method of claim 2, wherein configuring a ring oscillator within a region of the plurality of regions of the integrated circuit comprises:

downloading a configuration bit stream into a configuration memory space of the integrated circuit; and configuring an integer number of inverting devices within the integrated circuit in response to downloading the configuration bit stream.

4. The method of claim 3, wherein configuring an integer number of inverting devices comprises configuring an odd number of random access memory blocks coupled in series with one another.

5. The method of claim 1, wherein configuring the comparison circuitry within the integrated circuit to be compatible with the arbitrary reference signal comprises:

downloading a configuration bit stream into a configuration memory space of the integrated circuit; and programming a target count value used by the comparison circuitry in response to downloading the configuration bit stream.

6. The method of claim 5, wherein the target count value relates to a frequency of operation of an oscillating signal of the plurality of oscillating signals to integer multiples of the frequency of operation of the arbitrary reference signal.

7. The method of claim 6, wherein applying a regulated voltage signal to the plurality of regions of the integrated circuit comprises applying an operational voltage signal to operational power input terminals of transistors of the integrated circuit.

8. The method of claim 7, wherein modifying a magnitude of the regulated voltage signal comprises increasing a magnitude of the operational voltage signal in response to a determination that the frequency of operation of the region having the slowest propagation speed is lower than the frequency of operation of the arbitrary reference signal.

9. The method of claim 8, wherein modifying a magnitude of the regulated voltage signal comprises decreasing the magnitude of the operational voltage signal in response to a determination that the frequency of operation of the region having the slowest propagation speed of the plurality of regions is higher than the frequency of operation of the arbitrary reference signal.

10. The method of claim 6, wherein applying a regulated voltage signal to the plurality of regions of the integrated circuit comprises applying a bias signal to transistor body bias terminals of transistors of the integrated circuit.

11. The method of claim 10, wherein modifying a magnitude of the regulated voltage signal comprises increasing a magnitude of the bias signal in response to a determination that the frequency of operation of the region having the slowest propagation speed of the plurality of regions is lower than the frequency of operation of the arbitrary reference signal.

12. The method of claim 11, wherein modifying a magnitude of the regulated voltage signal comprises decreasing the magnitude of the bias signal in response to a determination that the frequency of operation of the region having the slowest propagation speed of the plurality of regions is higher than the frequency of operation of the arbitrary reference signal.

13. An integrated circuit, comprising:

a configuration memory space coupled to receive a configuration bit stream to define a plurality of regions within the integrated circuit;

a detection circuit configured within each of the plurality of regions in response to receiving the configuration bit stream, each detection circuit including, a ring oscillator adapted to generate an oscillating signal, the oscillating signal being indicative of a propagation speed of the respective region;

a first counter coupled to receive the oscillating signal, the first counter adapted to assert a trigger signal in response to detecting an integer number of transitions of the oscillating signal; and a second counter coupled to receive a reference signal and the trigger signal, the second counter adapted to provide a measured count value indicative of the number of transitions of the reference signal occurring prior to the assertion of the trigger signal; and a compensation circuit configured within the integrated circuit in response to receiving the configuration bit stream, the compensation circuit including a comparator circuit coupled to receive a target count value and adapted to modify the propagation speed of the integrated circuit by adjusting at least one of a supply voltage and a transistor body bias voltage coupled to each of the plurality of regions of the integrated circuit in response to a determination that one of the measured count values is different than the target count value;

wherein adjusting at least one of the supply voltage and the transistor body bias voltage coupled to each of the plurality of regions of the integrated circuit is based upon a determination, by the compensation circuit, of a slowest propagation speed of the plurality of regions of the integrated circuit.

* * * * *